United States Patent
Murakami et al.

(10) Patent No.: US 7,910,463 B2
(45) Date of Patent: Mar. 22, 2011

(54) METHOD OF PRODUCING SIMOX WAFER

(75) Inventors: Yoshio Murakami, Tokyo (JP);
Bong-Gyun Ko, Tokyo (JP)

(73) Assignee: Sumco Corporation, Tokyo (JP)

( * ) Notice: Subject to any disclaimer, the term of this patent is extended or adjusted under 35 U.S.C. 154(b) by 354 days.

(21) Appl. No.: 11/784,999

(22) Filed: Apr. 9, 2007

(65) Prior Publication Data
US 2007/0238312 A1   Oct. 11, 2007

(30) Foreign Application Priority Data

Apr. 11, 2006   (JP) .................................. 2006-108183

(51) Int. Cl.
*H01L 21/00*   (2006.01)

(52) U.S. Cl. ......... 438/480; 438/149; 438/478; 438/479

(58) Field of Classification Search ................... 257/294, 257/502; 438/14, 149, 151, 162, 311, 409, 438/455, 459, 480, 664, 689, 795
See application file for complete search history.

(56) References Cited

U.S. PATENT DOCUMENTS

| | | | | |
|---|---|---|---|---|
| 6,083,324 | A | * | 7/2000 | Henley et al. ............... 148/33.2 |
| 2002/0173123 | A1 | * | 11/2002 | Fogel et al. ................... 438/480 |
| 2004/0166612 | A1 | * | 8/2004 | Maydan et al. .............. 438/149 |

* cited by examiner

*Primary Examiner* — Thanh V Pham
*Assistant Examiner* — Errol Fernandes
(74) *Attorney, Agent, or Firm* — Sughrue Mion, PLLC

(57) ABSTRACT

A SIMOX wafer is produced by implanting an oxygen ion, in which a hydrogen ion is implanted at a dose of $10^{15}$-$10^{17}/cm^2$ before or after the step of the oxygen ion implantation.

5 Claims, 3 Drawing Sheets

(a)

(b)

(a)

(b)

(a)

(b)

METHOD OF PRODUCING SIMOX WAFER

BACKGROUND OF THE INVENTION

1. Field of the Invention

This invention relates to a thin film SOI wafer having a buried oxide film for forming a high-speed, low power consumption SOI (silicon on insulator) device, and more particularly to a SIMOX (separation by implanted oxygen) wafer in which the buried oxide film is formed by implanting an oxygen ion into a surface of a wafer and then annealing at a high temperature.

2. Description of Related Art

As a method of producing the thin film SOI wafer such as SIMOX wafer, there are known two methods, i.e. a first method is a so-called high-dose SIMOX forming method mainly including a step of implanting a high dose of oxygen ion ($^{16}O^+$), and a second method is a so-called low dose SIMOX forming method including a step of implanting an oxygen ion at a does lower by about one digit than that of the high-dose SIMOX forming method and then annealing in an oxidizing atmosphere having a high oxygen content.

Recently, there is developed a so-called MLD (modified low dose) method wherein a final step of oxygen ion implantation in the low-dose SIMOX forming method is carried out at a low dose in the vicinity of room temperature, which is provided in mass production.

The high-dose SIMOX method is typically a method wherein an oxygen ion ($^{16}O^+$) is implanted under conditions of an acceleration energy: 150 keV, a dose: more than $1.5 \times 10^{18}/cm^2$ and a substrate temperature: 500° C. and thereafter the annealing is carried out at a temperature of higher than 1300° C. in an argon (Ar) or nitrogen ($N_2$) atmosphere containing 0.5-2% of oxygen for 10-20 hours (see K. Izumi et al. Electron. Lett. (UK) vol. 17(1978), p 593).

Also, the low-dose SIMOX forming method is typically a method for solving problems of the above method, in which the oxygen ion ($^{16}O^+$) is implanted under conditions of an acceleration energy: more than 150 keV, a dose: $4 \times 10^{17}$-$1 \times 10^{18}/cm^2$ and a substrate temperature: 400-600° C. and thereafter the annealing inclusive of a high-temperature internal thermal oxidation (which may be abbreviated as ITOX) step is carried out at a temperature of higher than 1300° C. in an oxidizing atmosphere containing 30-60% of oxygen and argon (Ar), whereby the buried oxide film (BOX) can be thickened and also the significant improvement of the quality can be realized (see S. Nakashima et al. Proc. IEEE int. SOI Conf. (1994) p 71-72).

Further, the MLD (modified low dose) forming method is developed as an improving version of the low-dose SIMOX forming method and is a method in which after the oxygen ion implantation step at the conventional high temperature (400-650° C.), an oxygen ion implantation is further conducted at a dose lower than by one digit under room temperature to form an amorphous layer on the surface (see O. W. Holland et al. Appl. Phys. Lett. (USA) vol. 69 (1996), p 574 and U.S. Pat. No. 5,930,643).

There is known that all of these SIMOX forming methods include the high-temperature annealing step and particularly the annealing conditions at the final step thereof largely affect the final quality of the SIMOX wafer. Generally, a heat treatment is carried out at a temperature of higher than 1300° C. in an Ar atmosphere containing about 0.1-2% of oxygen for 10-20 hours at the final annealing step of SIMOX. In this case, it is known that the heat treatment vanishes residual defects, oxygen precipitates and the like in the SOI layer but also grows and unites oxygen precipitates in BOX to vanish defects in BOX, while the roughness at the interface between SOI and BOX is improved to finally improve the surface roughness.

However, the above conventional SIMOX forming methods have a problem that the annealing step at an extremely high temperature for a long time is required for realizing the roughness improving effect (flattening).

SUMMARY OF THE INVENTION

It is, therefore, an object of the invention to provide a method of producing a SIMOX wafer in which the surface roughness of SOI layer and the roughness at the interface between SOI layer and BOX film are improved (or flattened) to a level equal to or more than the conventional ones without deteriorating other properties even if the annealing is carried out at a low temperature for a short time.

The inventors have made various studies in order to obtain a sufficient roughness improving effect even in the annealing step at a low temperature for a short time and found that a viscosity of BOX film is lowered by implanting a given dose of hydrogen ion before or after the oxygen ion implantation and that the uniting, growing and flattening of oxygen precipitates are promoted by such a lowering of the viscosity and it is possible to largely improve the roughness in the annealing process at a lower temperature for a shorter time as compared with the conventional technique, and as a result, the invention has been accomplished.

The summary and construction of the invention are as follows:

(1) A method of producing a SIMOX wafer comprising a step of implanting an oxygen ion, in which a hydrogen ion is implanted at a dose of $10^{15}$-$10^{17}/cm^2$ before or after the step of the oxygen ion implantation.

(2) A method of producing a SIMOX wafer according to item (1), wherein the hydrogen ion is implanted at an acceleration energy up to a position equal to an implantation depth of the oxygen ion.

(3) A method of producing a SIMOX wafer according to item (1) or (2), wherein the step of the hydrogen ion implantation is carried out after the step of the oxygen ion implantation.

(4) A method of producing a SIMOX wafer according to item (3), wherein the step of the oxygen ion implantation is a two-stage implantation step in which an oxygen ion is implanted at a high dose of $(1\text{-}10) \times 10^{17}/cm^2$ at a relatively high temperature of 200-650° C. and thereafter an oxygen ion is implanted at a low dose of $(1\text{-}10) \times 10^{16}/cm^2$ at a low temperature.

(5) A method of producing a SIMOX wafer according to item (4), wherein an acceleration energy (E1) in the oxygen ion implantation at the high-temperature, high-dose step is 100-250 keV and an acceleration energy (E2) in the oxygen ion implantation at the low-temperature, low dose step is 100-250 keV and a difference of the acceleration energy therebetween (E1-E2) is 0-30 keV.

(6) A method of producing a SIMOX wafer according to item (3), wherein the step of the oxygen ion implantation is a one-stage implantation step in which an oxygen ion is implanted at a high dose of $(1\text{-}10) \times 10^{17}/cm^2$ at a relatively high temperature of 200-650° C.

According to the invention, it is possible to produce a SIMOX wafer in which the surface roughness of SOI and the roughness at the interface between SOI and BOX are improved (or flattened) to a level equal to or more than the conventional ones by implanting a given dose of hydrogen ion before or after the oxygen ion implantation without deteriorating other properties even if the annealing is carried out at a low temperature for a short time.

DESCRIPTION OF THE PREFERRED EMBODIMENTS

An embodiment of the invention will be described with reference to the accompanying drawings below.

Figure 1:
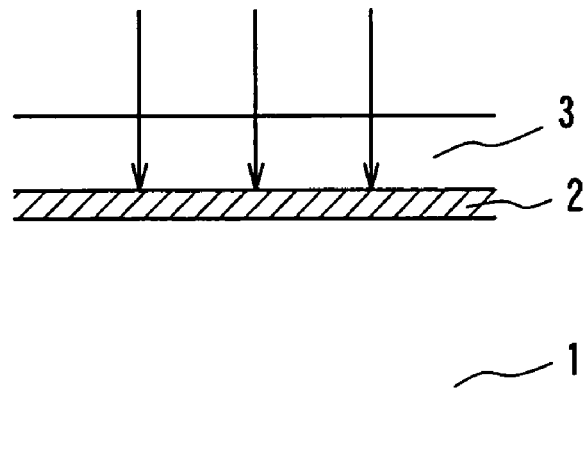
FIGS. 1(a) and (b) are schematic views for illustrating main steps in a method of producing a SIMOX wafer according to the invention, respectively.
Figure 1:
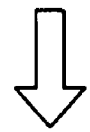
Figure 1:
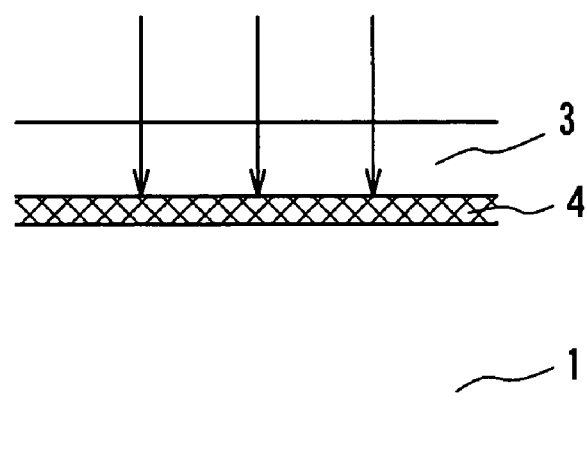

FIGS. 1(a) and (b) are schematic views for illustrating main steps in a method of producing a SIMOX wafer according to the invention, respectively, in which numeral 1 is a silicon substrate, numeral 2 an oxygen ion implanted layer, numeral 3 a surface silicon layer, and numeral 4 a buried oxide layer (BOX layer).

The method of producing a SIMOX wafer according to the invention can be applied to a SIMOX forming method comprising a step of implanting an oxygen ion ($O^+$ ion) into a surface of the silicon substrate 1 as shown in FIG. 1(a). As the SIMOX forming method are concretely mentioned a high-dose SIMOX forming method, a low-dose SIMOX forming method and a MLD method.

A main feature in the construction of the invention is a step of implanting a hydrogen ion at a dose of $10^{15}$-$10^{17}$/cm2 before or after the oxygen ion implantation step. Preferably, the hydrogen ion is implanted at an acceleration energy up to a position equal to an implantation depth of the oxygen ion. By adopting such a construction can be improved (flattened) the surface roughness of SOI and the roughness at the interface between SOI and BOX to a level equal to or more than the conventional ones without deteriorating other properties even if the annealing is carried out at a low temperature for a short time as compared with the conventional SIMOX forming methods.

In general, it is considered that in the SIMOX forming method, the implanted oxygen forms oxygen precipitates in the subsequent annealing step using the implantation damage as a nucleus, which are united to each other to form a flat BOX film together with the formation of a buried oxide film through oxygen fed from an exterior in the ITOX step to thereby flatten an interface between SOI and BOX. Since the flat state at the SOI/BOX interface is an stable equilibrium state (i.e. a low free energy state), in order to attain such a state in the conventional SIMOX forming method, it is considered that the annealing step is required to be carried out at a high temperature for a long time, concretely the annealing is carried out at a temperature of higher than 1300° C. for not less than 10 hours.

In the invention, however, the hydrogen ion is implanted at a dose of $10^5$-$10^{17}$/cm$^2$ in addition to the usual oxygen ion implantation, whereby hydrogen is entrained into the BOX film to lower the viscosity of the BOX, and hence the flattening of the BOX film can be attained at an extremely lower temperature for a shorter time.

When the dose of the hydrogen ion is less than $10^{15}$/cm$^2$, the remarkable effect of lowering the viscosity of the BOX film is not recognized, while when it exceeds $10^{17}$/cm$^2$, there is a fear that voids are formed in silicon to bring about the peeling of the wafer.

In the invention, it is particularly preferable that the hydrogen ion is implanted at an acceleration energy up to a position equal to an implantation depth of the oxygen ion in view of effectively entraining hydrogen into the BOX film. Moreover, the reason why the implantation depth of the hydrogen ion is the position equal to the implantation depth of the oxygen ion is due to the fact that since hydrogen is large in the diffusion coefficient, a depth position separated within ± about 150 nm from the implantation depth position of the oxygen ion (of BOX film) as a standard is a sufficiently allowable range.

Next, an embodiment that the production method of SIMOX wafer according to the invention is applied to the MLD method among the above three SIMOX forming methods will be described concretely.

Figure 2:
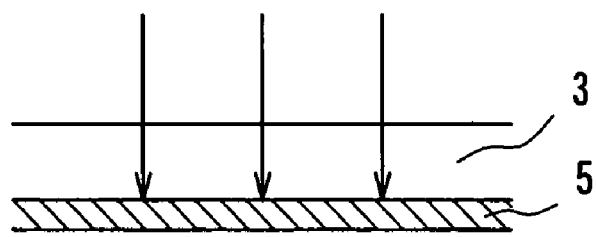
FIGS. 2(a) and (b) are schematic views for illustrating main steps in another method of producing a SIMOX wafer according to the invention, respectively.
Figure 2:
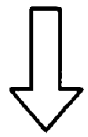
Figure 2:
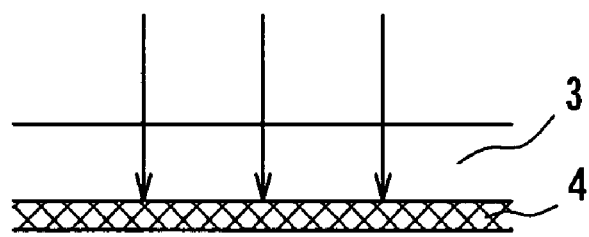

In FIGS. 1(a) and (b) is shown an embodiment that the hydrogen ion implantation step is conducted after the oxygen ion implantation step, while it is possible to conduct the oxygen ion implantation step after the hydrogen ion implantation step as shown in FIGS. 2(a) and (b). However, when the oxygen ion is implanted at a state of heating the substrate to a high temperature of higher than 200° C. in the oxygen ion implantation step, if the hydrogen ion is previously implanted, hydrogen once buried in the substrate is diffused outward in the implantation of the oxygen ion to easily decrease the amount of hydrogen buried. In the latter case, therefore, it is preferable to conduct the hydrogen ion implantation step after the oxygen ion implantation step.

Moreover, the production method of SOI substrate comprising a step of implanting oxygen ion after the implantation of hydrogen ion is disclosed in Japanese Patent No. 3097827. According to the method described in Japanese Patent No. 3097827, however, hydrogen ion is first implanted into the substrate and then the annealing treatment at a high temperature (800-1400° C.) is carried out to release hydrogen and form voids in the inside of the substrate, and thereafter oxygen ion is implanted to penetrate oxygen atom into the voids to thereby form SiOx and hence stably form a buried silicon oxide layer. That is, this patent document does not disclose the technique of the invention that the viscosity of BOX is changed to flatten the BOX film as an effect by the implantation of hydrogen ion.

Also, JP-A-2000-31079 discloses a method of producing SOI substrate comprising a step of implanting hydrogen ion and oxygen ion into a surface of the substrate in a properly selected order. However, the method described in JP-A-2000-31079 aims at the effect of reducing a dislocation density and has a problem that conditions improving the roughness are insufficient. Also, since the substrate is heated to 500° C. in the implantation of oxygen ion, if oxygen ion is implanted after the implantation of hydrogen ion, hydrogen once buried in the substrate is diffused outward in the implantation of oxygen ion and hence there is a fear that the effect of the invention can not be developed sufficiently.

Application of the Invention to MLD Method

Invention Example

Figure 3:
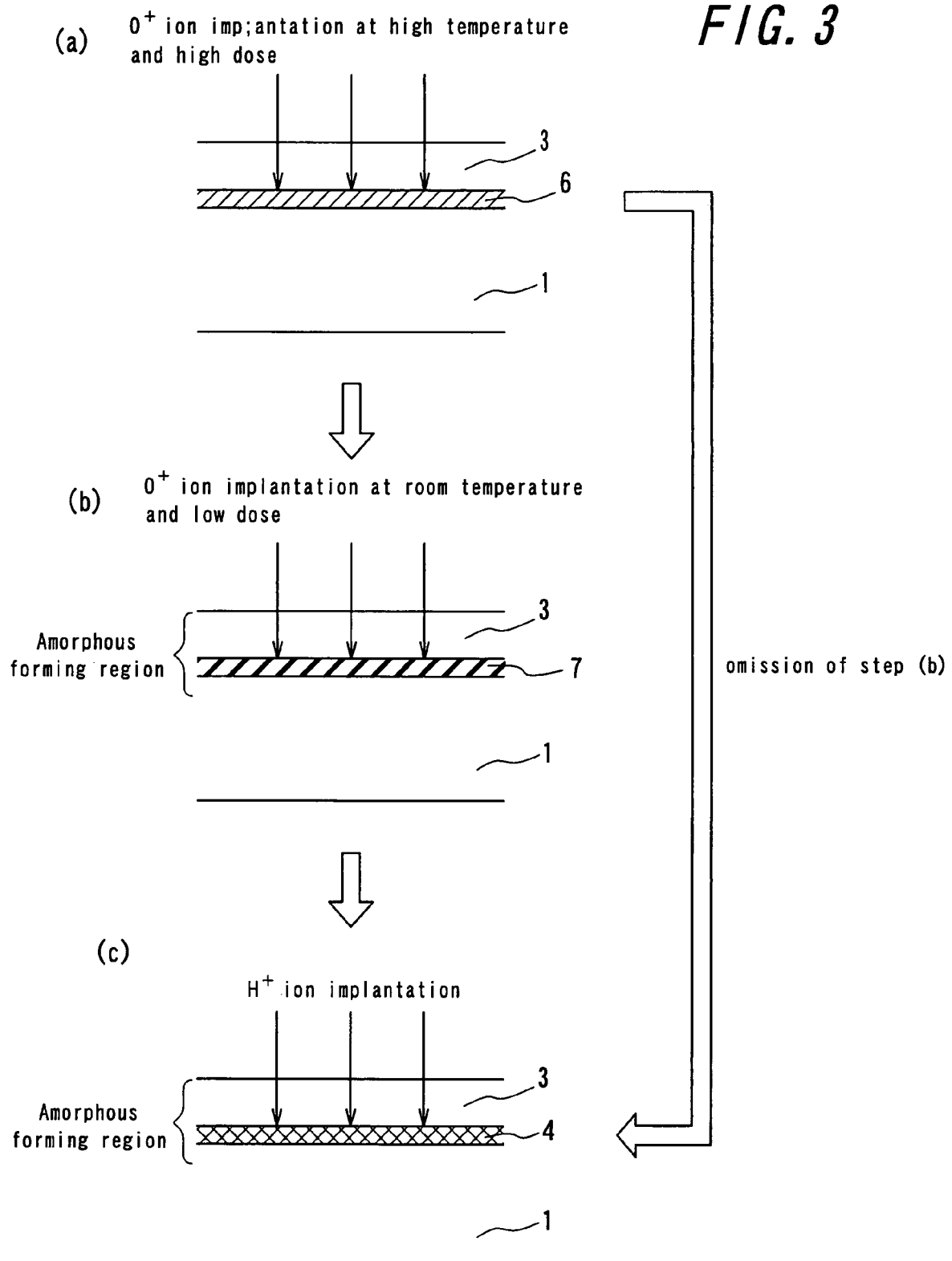
FIGS. 3(a) to (c) are schematic views for illustrating main steps in the other method of producing a SIMOX wafer according to the invention, respectively.

An embodiment of applying the invention method to the MLD forming method will be explained below;

FIGS. 3(a), (b) and (c) shows sectional construction of a wafer when the invention method is applied to the MLD forming method, respectively.

In this method, there are carried out a high-temperature, high dose step wherein an oxygen ($^{16}O^+$) ion is first implanted under conditions of an acceleration energy: 100-250 keV, a dose: $(1-10) \times 10^{17}/cm^2$ and a substrate temperature: 200-650° C. and a low-temperature, low dose step wherein the oxygen ion is implanted under conditions of an acceleration energy: 100-250 keV, a dose: $(1-10) \times 10^{15}/cm^2$ and a substrate temperature: 20-150° C. (two-stage implantation step).

Then, a hydrogen ($H^+$) ion is implanted under conditions of an acceleration energy rendering into a position equal to an implantation depth of the oxygen ion, concretely 100-250 keV, a dose: $10^{15}-10^{17}/cm^2$ and a substrate temperature: 20-150° C. to form an amorphous layer on the substrate surface (hydrogen ion implantation step).

Thereafter, the substrate is subjected to ITOX treatment in an argon atmosphere containing 45 volume % of oxygen at a temperature of 1250-1300° C. for 5-10 hours and further to an annealing in an argon (Ar) or nitrogen ($N_2$) atmosphere containing 0.5-2% of oxygen at a temperature of 1300-1350° C. for 5-10 hours, whereby there can be obtained a SIMOX wafer having both flattened SOI surface and interface between SOI and BOX.

In the invention method, the hydrogen ion implantation step may be carried out before the oxygen ion implantation step (two-stage implantation step). However, when the oxygen ion is implanted at a state of heating the substrate to a high temperature of higher than 200° C. in the oxygen ion implantation step, if the hydrogen ion is previously implanted, hydrogen once buried in the substrate is diffused outward in the implantation of the oxygen ion to easily decrease the amount of hydrogen buried, so that it is preferable that the hydrogen ion implantation step is conducted after the oxygen ion implantation step in such a case.

In the invention method, the hydrogen ion implantation develops an effect of promoting the formation of the amorphous layer in accordance with the does of the hydrogen ion (preferably $5 \times 10^{16}-1 \times 10^{17}/cm^2$), so that if such an effect is obtained, the low-temperature, low-dose step can be omitted in the two-stage implantation step.

In case of adopting the two-stage implantation step, it is preferable that the acceleration energy (E1) in the oxygen ion implantation at the high-temperature, high-dose step is 100-250 keV and the acceleration energy (E2) in the oxygen ion implantation at the low-temperature, low dose step is 100-250 keV and the difference of the acceleration energies (E1-E2) is within a range of 5-30 keV. When the difference is less than 5 keV, there is a problem that the pressure resistance of the BOX film lowers, while when it exceeds 30 keV, there is a problem that the surface roughness of SOI and the roughness at SOI/BOX interface are deteriorated.

Although the above shows only a typical embodiment, various modifications may be added within a scope of the invention.

There is prepared a SIMOX wafer using the invention method, and the surface roughness of SOI and roughness at the interface between SOI and BOX are evaluated as follows.

Test Example

In this example, SIMOX wafers are prepared by implanting an oxygen ion under conditions of an acceleration energy: 170 keV, a dose: $2.5 \times 10^{17}/cm^2$ and a substrate temperature: 400° C. and further under conditions of an acceleration energy: 155 keV, a dose: $2 \times 10^{15}/cm^2$ and a substrate temperature: 25° C. (room temperature), and then implanting a hydrogen ion at a different dose of $(0.1-10) \times 10^{15}/cm^2$ under conditions of an acceleration energy: 35 keV and a substrate temperature: 25° C. (room temperature), and thereafter conducting ITOX treatment in an argon atmosphere containing 45 volume % of oxygen at a temperature of 1320° C. for 10 hours and annealing in an argon atmosphere containing 2% of oxygen at a temperature of 1350° C. for 5, 7 or 10 hours.

Conventional Example

For the reference, a SIMOX wafer is prepared in the same manner as in the above test example except that the hydrogen ion implantation step is omitted.

(Evaluation Method)

The surface roughness of SOI layer and roughness at an interface between SOI layer and BOX film are evaluated by measuring them with respect to a size of 10 μm×10 μm by means of an atomic force microscope (AFM) to determine a value of square mean square root (Rms).

In case of measuring the surface roughness of SOI layer, the SOI layer is subjected to a pre-treatment in a diluted HF for about 1 minute and thereafter washed with water and dried. In case of measuring the roughness at the interface between SOI layer and BOX film, the SOI layer is subjected to a pre-treatment in a diluted HF for about 1 minute and washed with water and dried, and thereafter it is immersed in an aqueous solution of KOH for 10 minutes to remove the SOI layer and then washed with water and dried.

The value of square mean square root (Rms) is determined according to the following equation when a displacement from a mean surface level in a vertical direction (Z-direction) is Zi:

$$Rms = \sqrt{(1/N) \sum_{i=1}^{N} Zi}$$

In this case, N is the number of measuring points and satisfies $$\sum_{i=1}^{N} Zi = 0.$$

In Table 1 are shown the measured results on the surface roughness of SOI layer and roughness at the interface between SOI layer and BOX film.

TABLE 1

| | Dose of hydrogen ion ($\times 10^{15}/cm^2$) | Surface of SOI layer Annealing time | | | Interface between SOI layer of BOX film Annealing time | | |
|---|---|---|---|---|---|---|---|
| | | 5 hours | 7 hours | 10 hours | 5 hours | 7 hours | 10 hours |
| Conventional Example | 0 | 7.2 | 6.3 | 5.5 | 7.0 | 6.0 | 5.2 |
| Test Example | 0.1 | 7.1 | 6.2 | 5.4 | 7.0 | 6.1 | 5.1 |
| | 0.2 | 6.9 | 6.1 | 5.3 | 6.8 | 6.0 | 5.0 |
| | 0.6 | 6.7 | 6.0 | 5.1 | 6.7 | 5.9 | 4.8 |
| | 0.8 | 6.4 | 5.8 | 4.9 | 6.3 | 5.7 | 4.6 |
| | 1 | 5.4 | 4.6 | 3.9 | 5.3 | 4.4 | 3.7 |
| | 2 | 5.0 | 4.3 | 3.6 | 4.9 | 4.3 | 3.4 |
| | 4 | 4.4 | 3.8 | 3.2 | 4.3 | 3.6 | 3.0 |
| | 6 | 4.1 | 3.6 | 2.8 | 3.9 | 3.5 | 2.6 |
| | 8 | 3.9 | 3.2 | 2.5 | 3.8 | 3.1 | 2.3 |
| | 10 | 3.8 | 3.0 | 2.2 | 3.7 | 2.9 | 2.0 |
| | 20 | 3.7 | 2.9 | 2.0 | 3.5 | 2.8 | 1.8 |

TABLE 1-continued

| Dose of hydrogen ion ($\times 10^{15}/cm^2$) | Surface of SOI layer Annealing time | | | Interface between SOI layer of BOX film Annealing time | | |
|---|---|---|---|---|---|---|
| | 5 hours | 7 hours | 10 hours | 5 hours | 7 hours | 10 hours |
| 40 | 3.7 | 2.8 | 1.9 | 3.6 | 2.7 | 1.7 |
| 60 | 3.6 | 2.7 | 1.8 | 3.5 | 2.6 | 1.6 |
| 80 | 3.6 | 2.7 | 1.8 | 3.5 | 2.5 | 1.5 |
| 100 | 3.6 | 2.7 | 1.8 | 3.4 | 2.5 | 1.5 |

As seen from the results of Table 1, when the dose of the hydrogen ion is $(1-100)\times 10^{15}/cm^2$ among the test examples, the values of both the surface roughness of SOI layer and roughness at the interface between SOI layer and BOX film are equal to or more than those of Conventional Example even in the annealing treatment of 5 hours and the flattening on the surface of the SOI layer and the interface between SOI layer and BOx film is attained and the good roughness is obtained even in the annealing for a relatively short time.

According to the invention, it is possible to produce a SIMOX wafer in which the surface roughness of SOI and the roughness at the interface between SOI and BOX are improved (or flattened) to a level equal to or more than the conventional ones by implanting a given dose of hydrogen ion before or after the oxygen ion implantation without deteriorating other properties even if the annealing is carried out at a low temperature for a short time.

What is claimed is:
1. A method of producing a SIMOX wafer comprising a step of implanting an oxygen ion, in which a hydrogen ion is implanted at a dose of $10^{15}$-$10^{17}/cm^2$ before conducting any oxygen ion implantation; and
wherein the hydrogen ion is implanted at an acceleration energy up to a position equal to an implantation depth of the oxygen ion.
2. A method of producing a SIMOX wafer according to claim 1, wherein the step of the oxygen ion implantation is a two-stage implantation step in which an oxygen ion is implanted at a high dose of $(1-10)*10^{17}/cm^2$ at a relatively high temperature of 200-650 and thereafter an oxygen ion is implanted at a low dose of $(1-10)*10^{16}/cm^2$ at a low temperature.
3. A method of producing a SIMOX wafer according to claim 2, wherein an acceleration energy (E1) in the oxygen ion implantation at the high-temperature, high-dose step is 100-250 keV and an acceleration energy (E2) in the oxygen ion implantation at the low-temperature, low dose step is 100-250 keV and a difference of the acceleration energy therebetween (E1-E2) is 0-30 keV.
4. A method of producing a SIMOX wafer according to claim 1, wherein the step of the oxygen ion implantation is a one-stage implantation step in which an oxygen ion is implanted at a high dose of $(1-10)*10^{17}/cm^2$ at a relatively high temperature of 200-650° C.
5. A method of producing a SIMOX wafer according to claim 1, wherein the depth of the hydrogen ion implantation is within 150 nm of the oxygen ion implantation.

* * * * *